(12) United States Patent
Chou et al.

(10) Patent No.: US 8,852,494 B2
(45) Date of Patent: *Oct. 7, 2014

(54) METHOD AND APPARATUS OF ELECTRICAL FIELD ASSISTED IMPRINTING

(75) Inventors: Stephen Y. Chou, Princeton, NJ (US); Xiaogan Liang, Plainsboro, NJ (US)

(73) Assignee: Princeton University, Princeton, NJ (US)

( * ) Notice: Subject to any disclaimer, the term of this patent is extended or adjusted under 35 U.S.C. 154(b) by 1209 days.

This patent is subject to a terminal disclaimer.

(21) Appl. No.: 11/933,170

(22) Filed: Oct. 31, 2007

(65) Prior Publication Data

US 2008/0217822 A1    Sep. 11, 2008

Related U.S. Application Data

(63) Continuation-in-part of application No. 10/445,578, filed on May 27, 2003, now abandoned, and a continuation-in-part of application No. 10/731,818, filed on Dec. 9, 2003, now Pat. No. 7,482,057, which is a continuation of application No. 09/807,266, filed as application No. PCT/US99/23717 on Oct. 8, 1999, now Pat. No. 6,713,238.

(60) Provisional application No. 60/382,961, filed on May 24, 2002.

(51) Int. Cl.
*B29C 35/00*    (2006.01)

(52) U.S. Cl.
USPC ........... 264/484; 264/1.36; 264/402; 264/496

(58) Field of Classification Search
USPC ........... 264/1.1, 1.36, 2.4, 2.7, 484, 319, 402, 264/479, 494, 496; 425/3, 174; 156/60
See application file for complete search history.

(56) References Cited

U.S. PATENT DOCUMENTS

| | | | | |
|---|---|---|---|---|
| 3,454,686 A | * | 7/1969 | Jones | 264/1.36 |
| 4,731,155 A | * | 3/1988 | Napoli et al. | 216/44 |
| 7,887,739 B2 | * | 2/2011 | Chou et al. | 264/402 |
| 2003/0208888 A1 | * | 11/2003 | Fearing et al. | 24/442 |

FOREIGN PATENT DOCUMENTS

KR            549212        *   2/2006

\* cited by examiner

*Primary Examiner* — Mathieu D. Vargot
(74) *Attorney, Agent, or Firm* — Polster Lieder

(57) ABSTRACT

A method and apparatus for performing nanoimprint lithography. When an electric field is applied between the mold and the substrate, various forces can be generated among molds, substrates, and resists. The electrostatic force between the mold and the substrate can serve as an imprinting pressure to press the structured mold into the conformable resist. In addition, the electric field induces additional wetting forces (electrowetting or dielectrophoresis) in a liquid resist, which can assist the flow and filling of the liquid resist into fine structures.

38 Claims, 7 Drawing Sheets

Schematic of electric field – assisted imprint

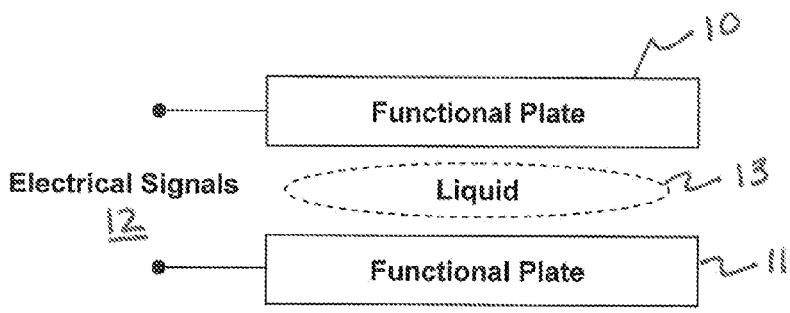
Figure 1. Schematic of the liquid manipulation by electrical signals applied between functional plates.
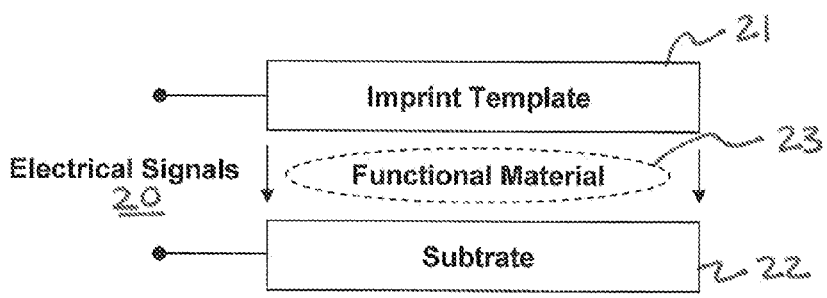
Fig. 2. Schematic of electric field – assisted imprint
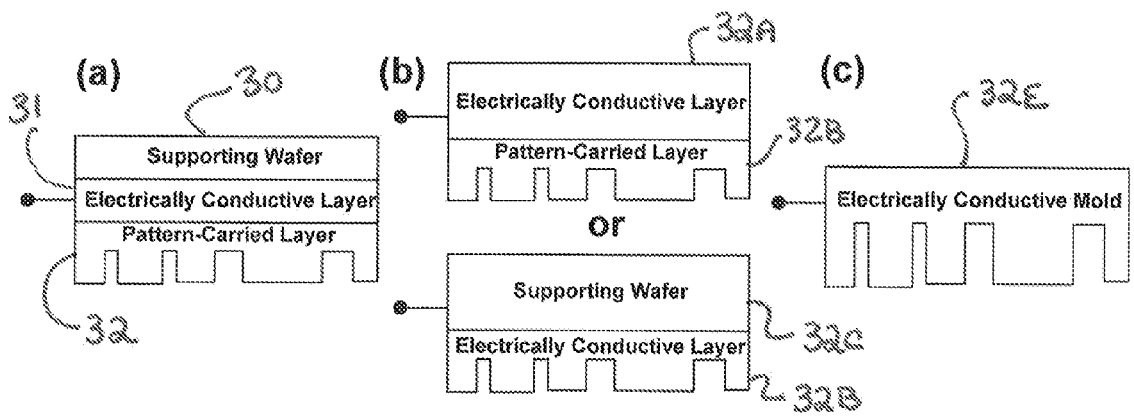
Fig. 3. The molds for electric field-assisted nanoimprint lithography

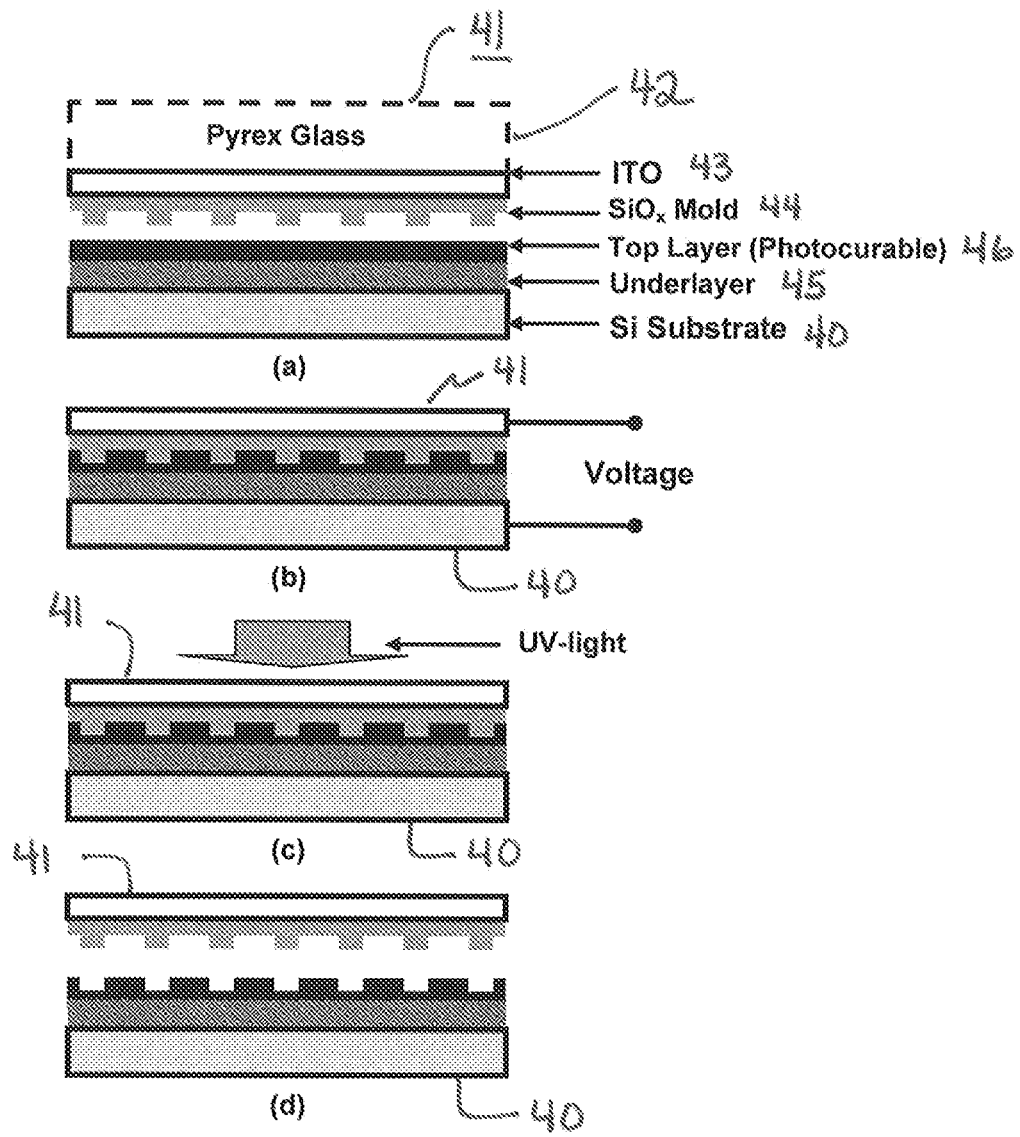
Figures 4A – 4D. One of examples of electric field – assisted imprint.

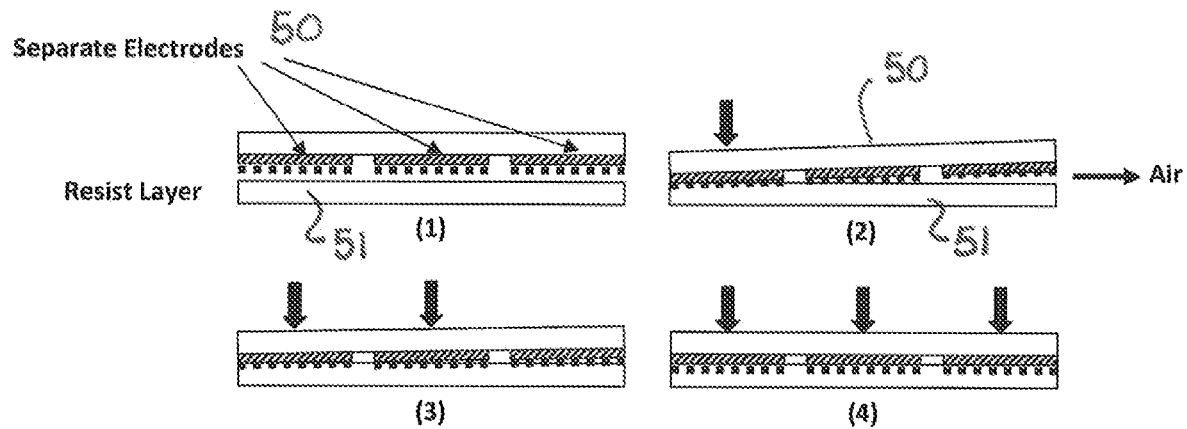
Fig. 5. One of examples of electric field – assisted imprint with multiple electrodes.
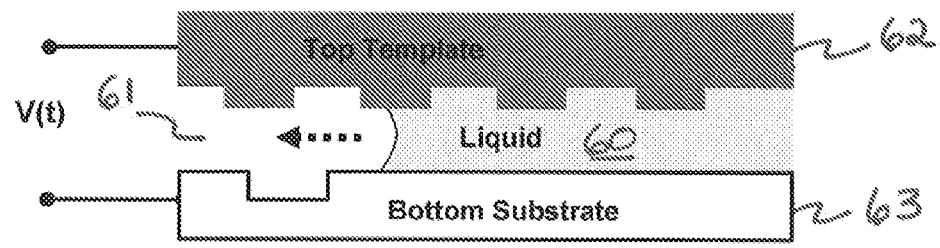
Fig. 6. Liquid filling assisted by electric field – induced wetting effects.
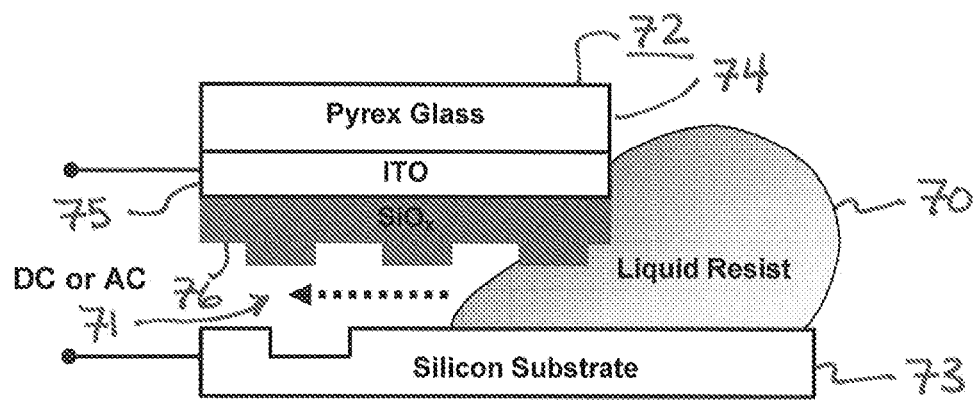
Fig. 7. One of examples about using electrowetting in NIL.

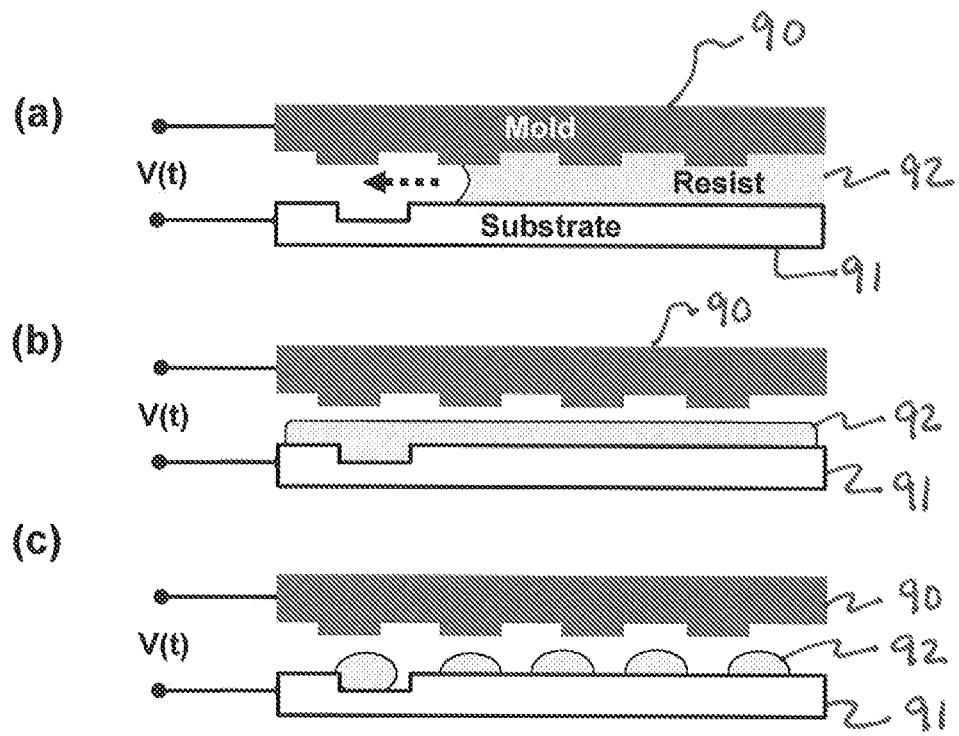
Fig. 9. Electrowetting-assisted liquid filling for various liquid pre-distributions.
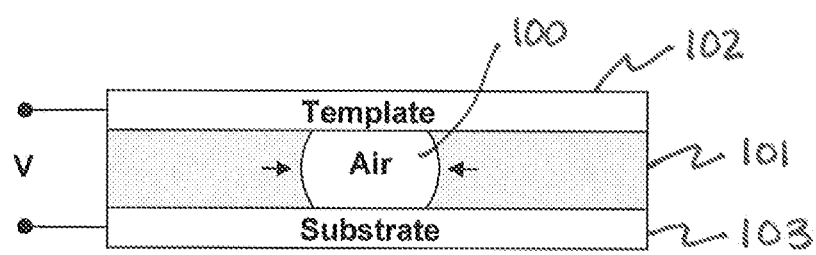
Fig. 10. Air bubble removal assisted by using electrowetting

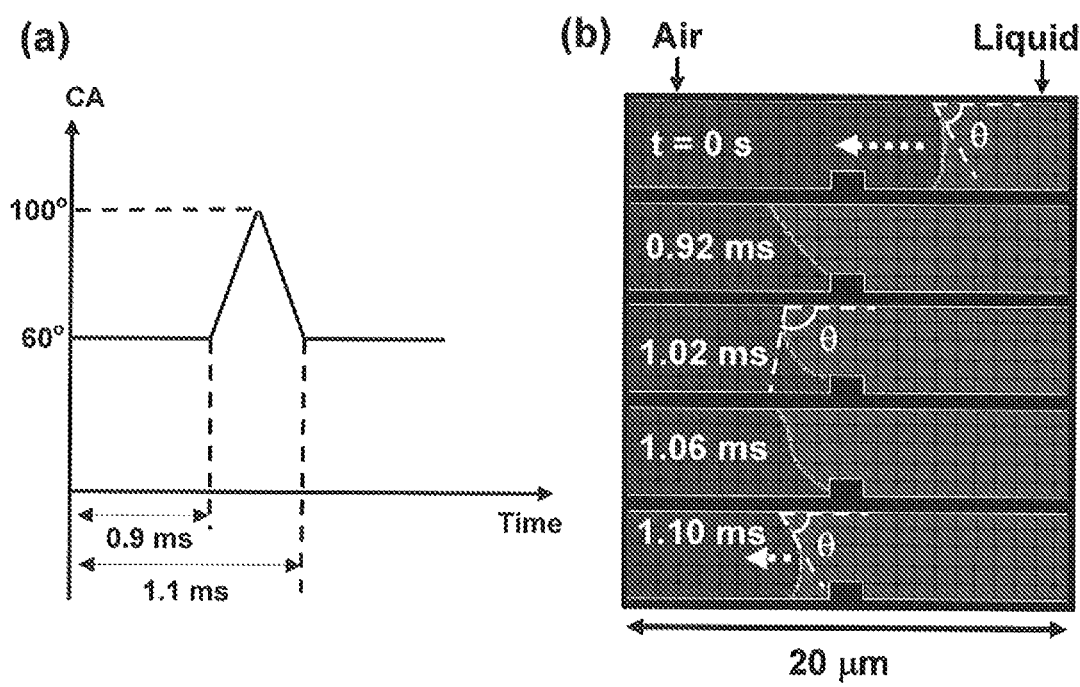
Fig. 13. Numerical simulation of the liquid flow driven by the electrowetting force.

METHOD AND APPARATUS OF ELECTRICAL FIELD ASSISTED IMPRINTING

CROSS-REFERENCE TO RELATED APPLICATIONS

This application is a continuation-in-part of U.S. Ser. No. 10/445,578, filed on May 27, 2003, now abandoned which is claims benefit of U.S. Provisional Application, No. 60/382,961, filed on May 24, 2002, and a continuation-in-part of U.S. application Ser. No. 10,731,818, filed on Dec. 9, 2003, now U.S. Pat. No. 7,482,057 which is a continuation of U.S. application Ser. No. 09/807,266, filed on Jun. 11, 2001, now U.S. Pat. No. 6,713,238, issued on Mar. 30, 2004 and filed as 371 of international Application No. PCT/US99/23717, filed on Oct. 8, 1999, each of which patents and patent applications are hereby incorporated herein by reference in their entirety.

STATEMENT REGARDING FEDERALLY SPONSORED RESEARCH

Not Applicable.

FIELD OF THE INVENTION

The present invention relates to methods and apparatus for use in nanoimprinting processes. The present invention also relates to processes that use an electric field to assist the imprint material flow on a mold or substrate, and to assist the pressure used in nanoimprint processes.

BACKGROUND OF THE INVENTION

Nanoimprint lithography (NIL) has been proved to be a low-cost, high-throughput patterning technology with sub-10 nm resolution. The pressing of a imprint mold into a deformable resist is a key issue affecting the performance and yield of NIL. The conventional methods include (a) a mechanical press using a pair of parallel plates, and (b) an air cushion press (ACP). Both of these methods have drawbacks. The solid plates can hardly generate uniform imprinting pressure within the imprint area, and they induce unexpected shear, rotation, and shift, degrading the over-alignment precision. The air cushion press can generate much more uniform imprinting pressure, but requires a vacuum/pressure chamber, which significantly increases the complexity of a NIL tool and the difficulty of over-layer alignment. Furthermore, there are issues of liquid flow between the mold and the substrate. Protrusions can block flow of a nanoimprint material, and small holes can prevent a complete filling.

In this invention, we present a new pressing method using electrostatic force between the mold and the substrate instead of mechanical force or fluidic pressure, and present a new method of moving nanoimprint materials between the mold and the substrate, unpinning flowing nanoimprint materials, and filling small holes with nanoimprint materials.

The liquid filling into the nano- and micro-features is anther important issue for nanoimprint lithography (NIL), other lithographic technologies based on liquid-filling, and micro- and nanofluidics. Incomplete filling leads to a poor patterning resolution and fidelity and introduces air bubble defects in the functional device structures.

Two key factors affecting the liquid filling are: (1) the dewetting nature of the plates, which expels the capillary filling of the liquid resists into the nanostructures; and (2) the pinning of the air/liquid interface to the micro- or nano-scale features, which can trap air bubbles and hence result in the incomplete resist filling.

There are two conventional methods for achieving complete fillings: (1) the use a sufficient gauge pressure to overcome the dewetting force, and hence drive the liquid into nanostructures. However, an overly large pressure is not desirable because it may damage the templates and device structures and degrade the overlay alignment accuracy in lithography. (2) Chemically changing the surface energy of the plates to make the surface wetting to the liquid. However, this chemical change may also permanently modify the surface properties and require complicated and high-cost chemical processes. For NIL, the adhesion force between the mold and the cured resists may be unexpectedly increased, and the mold separation becomes very difficult.

We present a novel method for filling the liquid resist and other functional materials into the mold/substrate gap and fine structures by using electrohydrodynamic actions (electrowetting, dielectrophoresis, or electrowetting-on-dielectric).

BRIEF SUMMARY OF THE INVENTION

The present invention is related to the method and apparatus for performing nanoimprint lithography. When an electric field is applied between the mold and the substrate, various forces can be generated among molds, substrates, and resists. The electrostatic force between the mold and the substrate can serve as an imprinting pressure to press the structured mold into the conformable resist. In addition, the electric field induces additional wetting forces (electrowetting or dielectrophoresis) in the liquid resist, which can assist the flow and filling of the liquid resist into fine structures.

The wetting flow of liquid resists driven by AC or other time-variable signals shows a much less chance of being pinned to the mold structures compared to that driven by a DC signal, which is proved to be an effective method to avoid the liquid pinning to fine structures, and reduce the air defects in nanoimprint lithography.

Furthermore, the present invention can also be used for the liquid actuation in micro- or nanofluidics. The liquid solution can be filled/evacuated in/out an enclosed fluidic device by turning ON/OFF the electric field between the cover-slip and the device substrate.

BRIEF DESCRIPTION OF THE SEVERAL VIEWS OF THE DRAWINGS

The advantages, nature, and features of the invention will appear more fully upon consideration of the illustrative embodiments now to be described in detail in connection with the accompanying drawings. In the drawings:

FIG. 1 is schematic illustration of liquid manipulation by electrical signals applied between plates;

FIG. 2 is a schematic illustration of electric field assisted imprinting;

FIGS. 3A, 3B, and 3C illustrate molds for field-assisted imprint lithography;

FIGS. 4A through 4D show field-assisted imprinting at various stages of the process;

FIG. 5 illustrates electric-field assisted imprinting using multiple electrodes;

FIG. 6 show fluid filling assisted by field-induced wetting;

FIG. 7 illustrates an additional example of field-induced wetting;

FIGS. 9A through 9C schematically illustrate electro-wetting assisted liquid filling for various liquid pre-distributions;

FIG. 10 shows an air bubble removal assisted by electro=wetting force;

FIG. 13 presents a numerical simulation of liquid flow driven by electro-wetting force.

DESCRIPTION OF THE PREFERRED EMBODIMENT

Figure 8:
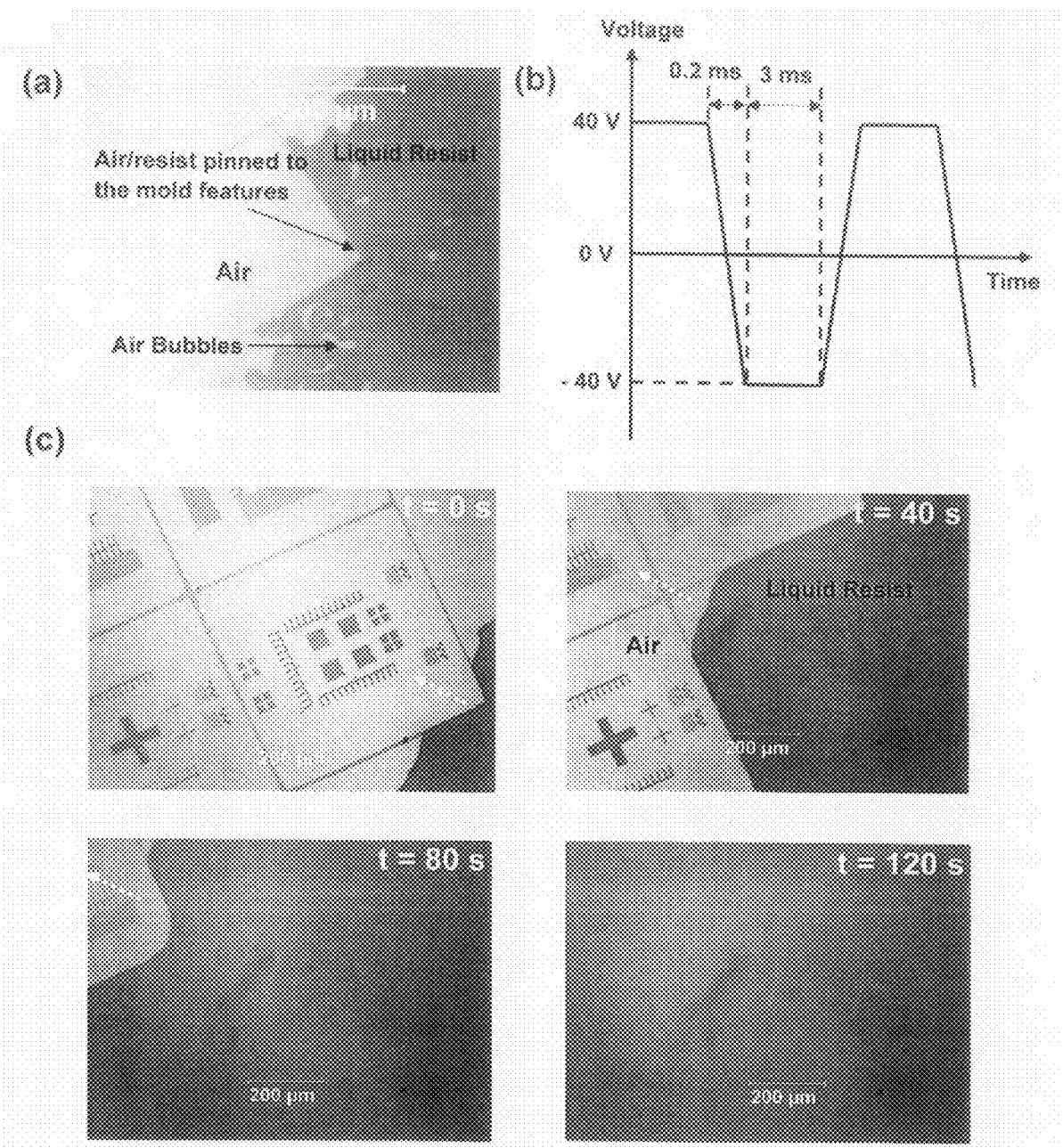
FIGS. 8A through 8C depict an experimental demonstration of electro-wetting.

FIG. 1 illustrates—electric field-assisted liquid manipulation between functional plates 10, 11. Here, the electrical signals 12 (AC, DC, or arbitrary time-sequential signals) can induce various physical effects (electrowetting, dielectrophoresis, electrowetting-on-dieletric, electrostatic action, or other electrodynamic actions), which can be employed to control the transport or distribution of a liquid 13 or other material between functional plates or structured surfaces.

FIG. 2 shows a first embodiment, in which electrical signals 20 applied between an imprint template (mold) 21 and a substrate 22 induces the electrostatic force, which serves as the imprinting pressure to press the template into a layer of conformable functional material 23 (e.g. resist). After template separation, the structures are patterned into the functional material.

For electric field-assisted imprint, a typical imprint mold consists three parts (FIG. 3a): a supporting wafer 30, an electrically conductive layer 31, and a layer 32 bearing imprinting features. The supporting wafer materials can be silicon, silicon oxide, fused silica, quartz, silicon nitride, glass, and other popularly used semiconductor or dielectric substrates. Furthermore, the relatively flexible polymeric substrates (e.g. plastics, rubbers, thermosets, or UV-curables) could also be employed to build the supporting wafer for reducing the imprinting pressure, and hence lowering the electric field required. The electrically conductive layers serve as the electrodes for applying the electrical potential on the mold, which can be metallic materials (e.g. Au, Ag, Ti, Pt, Ni, and Cr etc.), doped semiconductors (e.g. Si, Ge, III-V or II-VI compounds, etc.), electrically conductive polymers, or other conductive compounds (e.g indium-tin-oxide (ITO) for making optically transparent molds). The pattern-carried layers can be made of dielectric materials such as silicon oxide, silicon nitride, polymers, UV-curables, or other semiconductor compounds.

Besides the configuration shown in FIG. 3a, the molds for electric field-assisted imprint could be two-part (FIG. 3b: conductive layer/pattern-carried layer 32A/32B or supporting wafer/conductive layer 32C/32D bearing features), or single-part 32C (FIG. 3c: the conductive layer also serves as the pattern-carried layer) structure. Additionally, the individual part of an imprint mold could be made of a single material or the combination of multiple materials.

The features built on a pattern-carried layer can be 2D, 3D, or gradient topographic structures. The whole pattern layer can be a single continuous film or consist of multiple isolated pattern domains.

The functional materials or resists for imprint include the deformable materials (e.g. thermal plastics, rubbers, or molten solid surfaces) and liquid-phase precursors (e.g. thermosets, UV-curables, or thermally cured rubbers). The imprint course can be a thermal cycle process (thermal imprint), or thermally or UV-curing processes. The functional material can be spin-coated on the substrate as a thin film, or dispensed as droplets or liquid domains.

The substrates can be conductors (e.g. metals, heavily doped semiconductors), semiconductors (e.g. silicon, Ge, or III-V compounds), electrically conductive polymer wafers, or semiconductor-on-insulators (SOIs). For insulating substrates, additional conductive layers (e.g. electrically conductive polymers, metals, or semiconductors) can be deposited on the front- or back-sides for applying electrical potential.

The electrical signals for generating the electrostatic force can be DC, AC, or time-dependent variable signals. For accessing the external signal source to the electrically conductive layer on the mold, the contact electrodes are made on the front- or back-sides of the support wafer.

FIG. 4 illustrates electric field-assisted imprint into a spin-coated resist. In this particular example, the substrate 40 is semiconducting silicon, and the mold 41 consists of a Pyrex glass wafer 32 with a conducting layer 43 of ITO and a $SiO_2$ layer 47 for imprinting patterns (FIG. 4(a)).

An underlayer 45 and a photocurable top layer 46 are disposed on substrate 40. The relationship between this effective electrostatic pressure, P and the required field magnitude, E can be approximately described by Eqn. (1), in which $\epsilon_r$ is the average dielectric constant of resist layers between the mold and the Si wafer and is about 3 for our resists; V is the applied voltage; d is the distance between conductive layers (ITO and Si).

$$P = \frac{\epsilon_r^2 \epsilon_0}{2} E^2 = \frac{\epsilon_r^2 \epsilon_0}{2} \left(\frac{V}{d}\right)^2, \quad (1)$$

In order to generate one atmosphere pressure, an electric field of $5 \times 10^5$ V/cm is needed. This pressure is sufficient for imprinting UV-curable liquid precursors (NIL resists), as well as for deforming a standard Si wafer or the mold or both to make conformal contact over a large area. Here, double-layer resists (45, 46) were used with the top layer imprinted and cured (FIG. 4(b), (c), and (d)) and then transferred to the underlayer by reactive ion etching (RIE), thus increasing the aspect ratio of structures.

The conductive layers on the mold or substrate can be further patterned to form isolated multiple electrodes, with which the imprint can be performed on resist 57 in a step-by-step way. For example, FIG. 5 shows that each individual electrode 50 can be applied with the electrical signal to perform the addressable local imprint, and with a sequential program of multiple electrodes 50, the imprint course for different areas can be done in a programmed order. For example, with the multiple electrodes, the imprinting pressure can be applied on the mold from one edge to the other edge, and thus push the air between the mold and the substrate out of the imprinted area, significantly reducing the chance of trapping air bubbles for the large-area imprint (FIG. 5(2); FIG. 5(4)).

In FIG. 6 also present a novel method for filling liquid resist 60 into the gap 61 between an imprint mold 62 and a substrate 63, which method is based on the electric field-induced wetting effects. With an electric field applied between the top (mold) and bottom (substrate) plates, an electro-hydrodynamic force (electrowetting or dielectrophoresis) was generated and acted on the liquid layer 60. The liquid resist was then driven into the plate gap 61 and conformably filled into the micro- or nano-features on the mold or the substrate without any permanent modification of the surface energy and wettability of the solid surfaces.

For this liquid filling approach, the mold and the substrate are the same as the counterparts used in electric field-assisted imprint described above. The gap between the mold and the substrate can be formed in several ways: a). The mold and the substrate are just brought into a gentle contact with a closely zero initial pressure and subsequently clamped by using electrostatic force. During the liquid filling, the gap size is monitored by using spectrometers or other feed-back monitoring tools; b). The mold and the substrate are brought into a tight contact by applying a sufficiently high pressure. In this case, the gap size was determined by the height of the mold/substrate protrusion or specifically designed spacers; c). The mold and the substrate are temporarily bonded together by using an adhesion layer. This adhesion layer can be a chemical glue or plasma-activated solid surface.

The liquid resist can be thermally or UV-curable polymer precursors, nonpolar or polar functional liquids, aqueous or organic solutions, polymer melts.

The electrical signals applied between the mold and the substrate for generating the electric field can be DC, AC, or any time-dependent variable signals, or any combination of them. The frequency of the signal can vary 2 Hz to 10 GHz. The gap between the mold and substrate can be from 1 nm to 100 um. The trench width can be from 1 nm to 100 um and the depth can be from 1 nm to 500 um.

FIG. 7 illustrates electrowetting force to drive and fill liquid resist 70 into a gap 71 between a structured imprint mold 72 and a substrate 73. The mold 72 consists of a pyrex glass body 74 coated with a ITO layer as the electrode 75, and a $SiO_2$ layer 76 bearing the molding structures. The substrate 73 is a semiconducting Si wafer coated with a thin layer of oxide (not shown). Initially, the UV-curable liquid resist 70 is partially fed into the mold/substrate gap 71 from an edge. With the application of an electric field between the mold (ITO) and the substrate (Si), the liquid resist is actuated into the mold/substrate gap and conformably fills into the fine structures on the mold and the substrate.

We also found that the wetting force generated by different time-sequential electrical signals can result in different driving schemes for the liquid. For example, FIG. 8 shows an experimental demonstration of using AC electrowetting force to eliminate air bubbles pinned to mold features. Here, different driving signals (DC and AC) are applied between a mold and a substrate. The resist flow driven by a DC electrowetting force can be easily pinned to the mold topological features, which can result in a discontinuous air/liquid interface and trap air bubbles (FIG. 8a). However, with an AC driving signal plotted in FIG. 8b, the sequent video captures (top view) in FIG. 8c show that the air/liquid interface became much more smooth and continuous, and the permanent pinning to features and the air trapping can be effectively avoided.

FIG. 9 schematically illustrates that this electrowetting-assisted liquid filling method can be applied to different initial liquid distributions and different liquid delivery methods. Here, besides the filling from the edge opening between the mold 90 and the substrate 91 (FIG. 9a), the liquid 92 could also be spin-coated on the substrate (or the mold) as a thin film (FIG. 9b), or dispensed by using dispensing tools such as inkjet nozzles, micro-pipettes, or any other liquid dispensers (FIG. 9c). To completely fill the spin-coated liquid resist into fine structures, an electric field is applied between the mold and the substrate, which induces two main effects: a). The electrostatic force between the mold and the substrate serves as an imprinting pressure and presses the mold structures into the resist (electric field-assisted imprint); b). Additional electrohydrodynamic wetting forces (electrowetting, dielectrophoresis, or electrowetting-on-dielectric) are generated at the triple-phase-line (ambient gas\liquid resist\solid surface) and the resist body. These wetting forces serve as additional electro-capillary forces and significantly accelerate the capillary filling of the liquid resist into fine structures. For dispensed resist droplets or isolated liquid domains, the electric field between the mold and the substrate can also assist the spreading, mergence, and structure-filling of the liquid resists.

FIG. 10 illustrates the electrowetting force can increase the effective Laplace pressure acting on an air bubble 100 (or other ambient gases) trapped in a liquid layer 101 between a substrate 102 and a template 102, and hence increase the dissolution rate of the air bubble into the liquid, which provides an effective way for removing the air defects in lithography and micro/nanofluidic devices.

Figure 11:
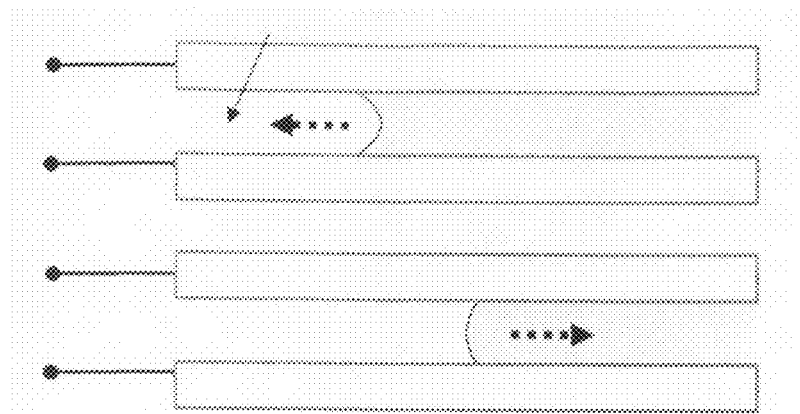
FIG. 11 schematically illustrates liquid filling and evacuation of micro- and nanofluidic devices.

Electrowetting can also be employed to fill and evacuate liquid solutions in or out of enclosed micro- and nanofluidic devices. In FIG. 11, a structured top plate 10 (the description is the same as the mold for electric field-assisted imprint and liquid filling) and a structured bottom plate 111 are bonded together to form an enclosed fluidic device structure. Initially, the solid surface inside the device is chemically treated so that a liquid is dewetting on it. With an electric field applied between the top and bottom plates, the electrohydrodynamic forces (electrowetting, dielectrophoresis, or electrowetting-on-dielectric) acting on the liquid make the liquid wet on the fluidic channel walls and actuate the liquid flow into the device. Afterwards, the liquid can also be evacuated from the fluidic device by turning off the electric field to recover the original dewetting state.

Figure 12:
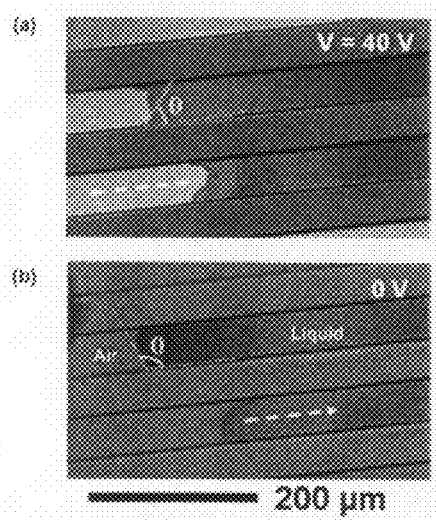
FIG. 12 depicts an experimental demonstration of liquid filling and evactuation of microfluidic channels assisted by electro-wetting force.

FIG. 12 depicts one of experimental demonstrations about filling/evacuation of an aqueous liquid solution into a microfluidic channel. The microfluidic channel is fabricated by bonding a pair of structured top/bottom plates. The adhesion layer is the oxygen plasma-activated oxide surface. The channel sidewalls are initially coated with a hydrophobic layer. FIG. 12a shows the inward resist flow (indicated by the dashed arrow) into the grating channel structures, which was driven by an electrowetting force generated by a voltage of 40 V. Once the voltage was turned off, the resist flow became backward (see the dashed arrow) and was finally expelled out of the grating features due to the dewetting nature of the solid surface, as shown in FIG. 12b. FIG. 12 also displays the change of the contact angle between the liquid and the solid sidewalls induced by the electric field, indicating the existence of the wetting force.

We developed the computational fluidic dynamics program to simulate the liquid flow actuated by the electrowetting force. For example, FIG. 13 shows the simulation of a wetting flow pinned to a topological feature. Initially, with a constant CA (DC electrowetting), the wetting flow was strapped at the protrusive feature (t~0.90 ms). Afterwards, the CA value had a swing course (plotted in FIG. 13a), which is induced by AC electrowetting force. The swing of CA made the triple-phase-line overcome the pinning barrier, and the wetting flow continue to move without trapping any air pockets.

It is to be understood that he above described embodiments are illustrative of only a few of the many possible specific embodiments that can represent applications of the invention. Numerous and varied other arrangements can be made by those skilled in the art without departing from the spirit and scope of the invention.

The invention claimed is:

1. A method of forming a patterned surface comprising the steps of:
    providing a mold having a molding surface, the mold including a conductive layer;
    disposing a substrate having a surface adjacent the molding surface but spaced therefrom by a gap, the substrate including a conductive layer;
    disposing within said gap a hardenable or curable liquid;
    applying an electric field between the conductive layers to facilitate a flow of said liquid in the gap, to change wetting or filling of said liquid on said molding and substrate surfaces, and to generate an electrostatic force between said mold and said substrate to imprint said liquid; and
    hardening or curing the liquid to form the patterned surface.

2. The method of claim 1 wherein said electric field is generated by a time-dependent variable signal having a frequency between 2 Hz and 10 GHz.

3. The method of claim 1 said step of applying an electric field includes applying an alternating current driving signal between said mold conductive layer and said substrate conductive layer.

4. The method of claim 1 wherein said flow is induced by an electro-hydrodynamic wetting force generated at a triple-phase-line defined as an intersection of an ambient gas, the applied liquid and at least one of the substrate and the mold.

5. The method of claim 1 further including the step of temporarily bonding said mold to said substrate with an adhesion layer prior to said application of said electric field.

6. The method of claim 5 wherein said adhesion layer is a chemical glue.

7. The method of claim 1 further including the step of aligning said mold and said substrate prior to applying said electric field.

8. The method of claim 1 wherein said molding surface includes at least one molding feature to imprint said patterned surface.

9. The method of claim 8 wherein said molding surface has at least two molding features spaced apart by less than 200 nanometers.

10. The method of claim 8 wherein said at least one molding feature has a depth in a range from 1 nm to 500 um.

11. The method of claim 1 wherein said flow of liquid has a thickness in the range of 0.1 to 100 μm.

12. The method of claim 1 further including the step of monitoring a size of said gap during said application of said electric field.

13. The method of claim 1 further including the step of selecting said gap size prior to application of said electric field.

14. The method of claim 13 wherein said gap size is selected in response to a size of a feature of said pattern.

15. The method of claim 1 wherein said substrate is a conductor, a semiconductor, an electrically conductive polymer wafer, or a semiconductor-on-insulator.

16. The method of claim 1 wherein said substrate is an insulator, and wherein said conductive layer is disposed on at least one surface thereof.

17. The method of claim 1 wherein said mold conductive layer and said substrate conductive layer define a plurality of isolated electrodes.

18. The method of claim 17 wherein said step of applying said electric field includes selectively activating at least one of said isolated electrodes.

19. The method of claim 17 wherein said step of applying said electric field includes selectively activating said isolated electrodes in a selected sequence.

20. The method of claim 17 wherein said step of applying said electric field includes selectively activating said isolated electrodes in a sequence selected to drive said flow of liquid through said gap and/or to expel air from said gap.

21. The method of claim 20 wherein said flow of liquid is driven in a selected direction through said gap between said mold and said substrate.

22. The method of claim 20 wherein said flow of liquid is driven to a selected position within said gap between said mold and said substrate.

23. The method of claim 1 wherein said liquid is selected from a set of liquids including thermally or UV-curable polymer precursors, nonpolar or polar functional liquids, aqueous or organic solutions, and polymer melts.

24. The method of claim 1 wherein said step of applying said electric field includes varying said electric field during said flow of liquid to facilitate elimination of air bubbles between said mold and said substrate.

25. The method of claim 1 wherein said step of applying said electric field includes varying said electric field during said flow of liquid to regulate a characteristic of said flow of liquid.

26. The method of claim 1 wherein said step of applying said electric field imparts a pressure in said liquid to facilitate air absorption by said liquid within said gap.

27. The method of claim 1 wherein said step of applying said electric field alters the triple phase line of liquid, solid and vapor states of said liquid within said gap.

28. The method of claim 1 wherein said step of disposing said liquid within said gap is implemented by a process selected from a set of disposition processes, including application of liquid droplets, spin coating of the substrate, and dispensing through one or more dispensing tool.

29. The method of claim 1 further including the application of an additional imprinting force to imprint said mold into said liquid, said additional imprinting force selected from a set of forces including an electromagnetic force, an external fluid pressure, an external air pressure, and a mechanical pressure.

30. The method of claim 1 wherein said mold includes a supporting wafer with said conducting layer, and wherein said molding surface bears a set of imprinting features.

31. The method of claim 30 wherein said supporting wafer is composed of a material selected from a set of materials including silicon, silicon oxide, fused silica, quartz, silicon nitride, glass, semiconductors or dielectric substrates.

32. The method of claim 30 wherein said supporting wafer is composed of a material selected from a set of materials including flexible polymeric substrates.

33. The method of claim 1 wherein said mold conductive layer and said substrate conductive layer are each composed of a material selected from a set of materials including metallic materials, doped semiconductors, electrically conductive polymers, or other conductive compounds.

34. The method of claim 1 wherein said molding surface is composed of a dielectric material.

35. The method of claim 1 wherein said molding surface is a surface of said conductive layer.

36. The method of claim 1 wherein said molding surface is disposed on a layer of said mold which is separate from said conductive layer.

37. The method of claim 1 wherein said molding surface defines at least one two-dimensional, three-dimensional, or gradient topographical structure.

38. The method of claim 1 wherein said molding surface defines a plurality of isolated pattern domains for imprinting said patterned surface.

\* \* \* \* \*